(12) United States Patent
Nagashima

(10) Patent No.: US 6,356,182 B1
(45) Date of Patent: Mar. 12, 2002

(54) PLANAR EMI INDUCTOR

(75) Inventor: James Nagashima, Cerritos, CA (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 09/484,657

(22) Filed: Sep. 20, 1999

(51) Int. Cl.[7] .................................................. H01F 5/00
(52) U.S. Cl. ........................ 336/200; 336/232; 336/223
(58) Field of Search ................................ 336/200, 223, 336/232, 83, 61

(56) References Cited

U.S. PATENT DOCUMENTS

| | | | | |
|---|---|---|---|---|
| 4,622,627 A | * | 11/1986 | Rodriguez et al. | 363/37 |
| 5,321,380 A | * | 6/1994 | Godek et al. | 336/232 |
| 5,929,733 A | * | 7/1999 | Anzawa et al. | 336/61 |
| 5,990,776 A | * | 11/1999 | Jitaru | 336/200 |
| 6,028,500 A | * | 2/2000 | Buist | 336/100 |

* cited by examiner

*Primary Examiner*—Anh Mai
(74) *Attorney, Agent, or Firm*—Cary W. Brooks

(57) ABSTRACT

A power bus bar assembly comprising planar electromagnetic interference (EMI) inductors. An exemplary power bus bar assembly or planar inductor comprises upper and lower E-E magnetic cores, and upper and lower flat bus bars that are insulated from each other. The bus bars have a plurality of core cut-outs that allow the cores to pass through them. The core cut-outs form an electrical path through the E-E cores that forms a turn that provides a predetermined amount of inductance. The bus bars may be arranged to form turns in the same direction or opposing directions that provide for a common mode and differential mode inductors, respectively. Different core materials and stacking of multiple cores may be used to improve the frequency response of the inductor.

20 Claims, 5 Drawing Sheets

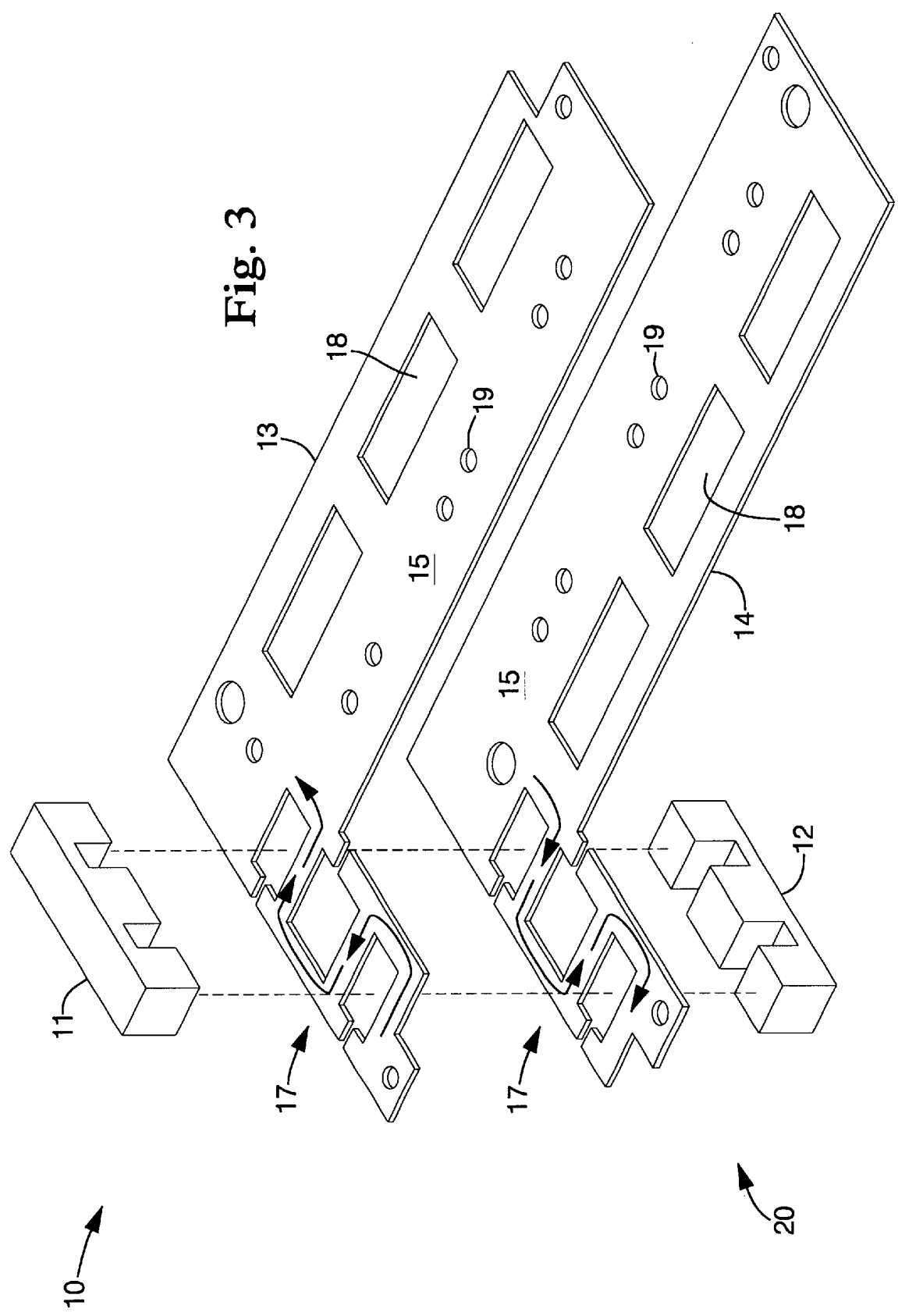

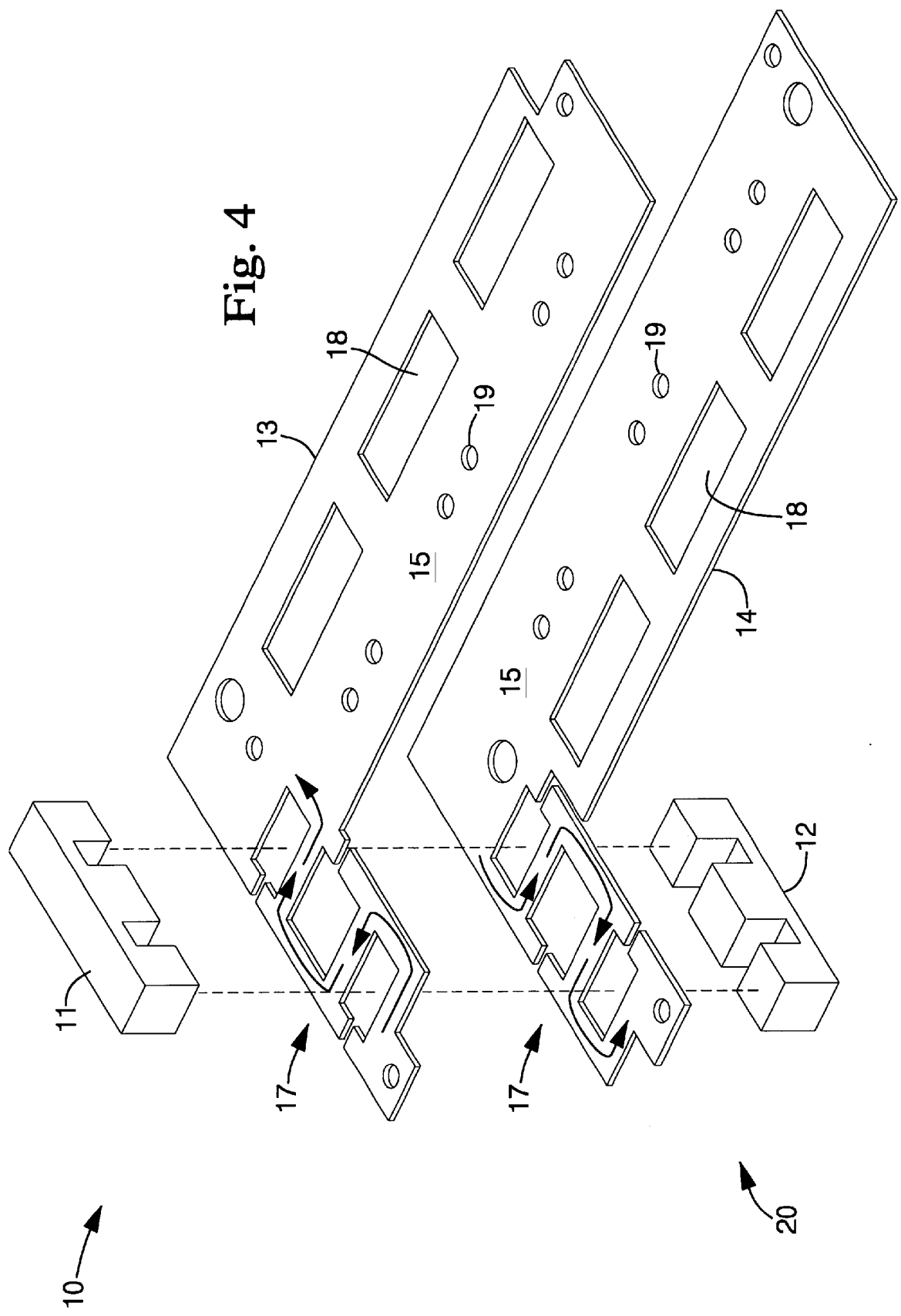

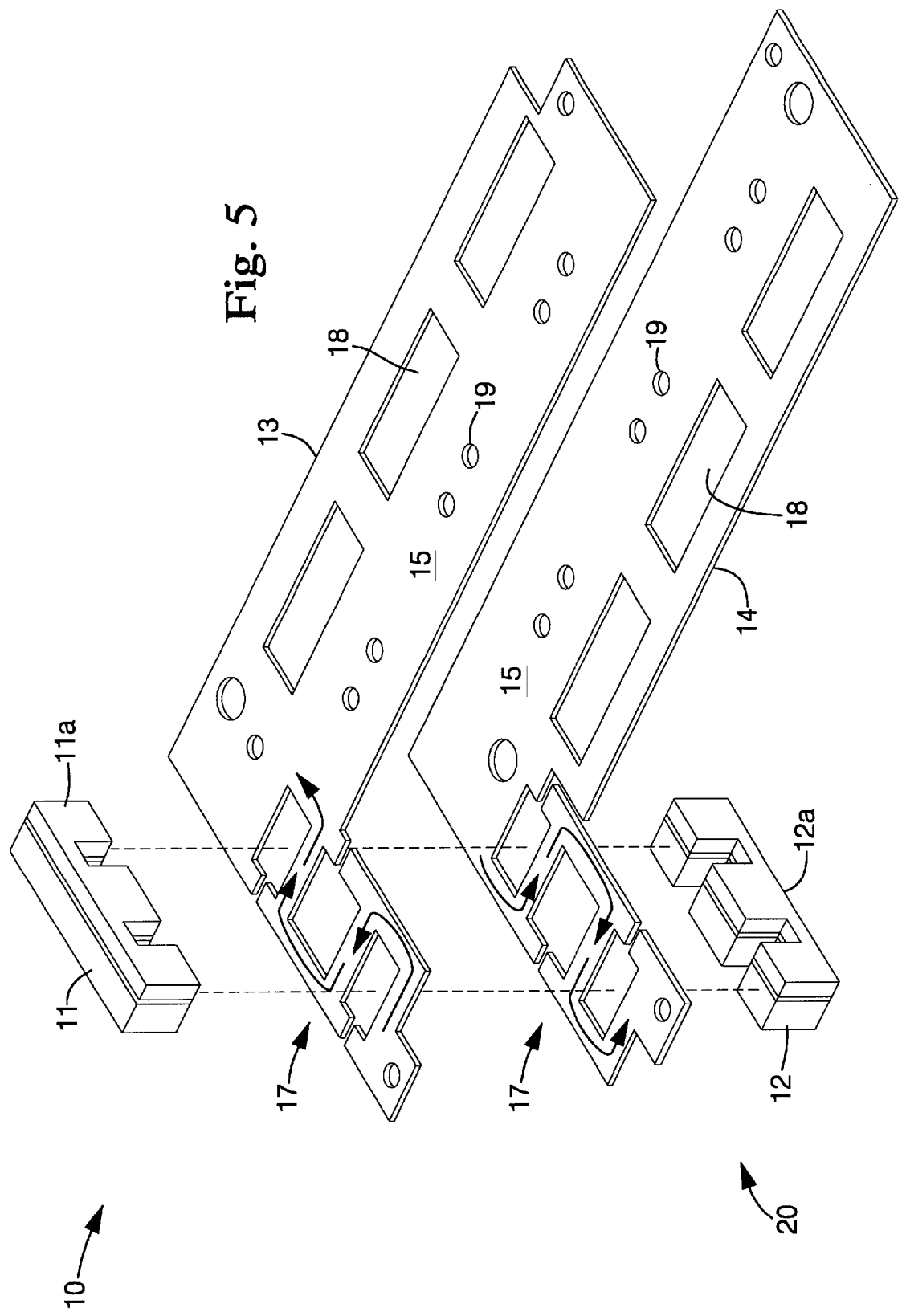

PLANAR EMI INDUCTOR

BACKGROUND

The present invention relates generally to electric vehicle power electronics, and more particularly, to planar EMI inductors using E-E magnetic cores that may be employed in power conditioning equipment.

The assignee of the present invention designs and develops electric vehicle propulsion systems and other power conditioning equipment. Heretofore, electric vehicle propulsion systems developed by the assignee of the present invention and others have employed a variety of different magnetic core and inductor configurations.

One implementation used E-E magnetic cores with a heavy insulated foil winding. Another implementation used E-E magnetic cores with a bent bus bar. Another implementation used C-C magnetic cores around a straight bus bar. Another implementation used toroidal magnetic cores with a straight bus bar.

The prior art approaches each have limitations that detract from their overall usefulness. For example C-C and toroidal magnetic cores are relatively expensive and require additional machining or bends. C-C cores and toroidal core magnetics used with a straight bus bar reduce the complexity of the bus bar but use higher cost cores and provide lower unit inductance. Certain of the approaches require extensive hand labor during assembly. Other limitations include trying to bend heavy gauge copper into bus bars.

It would therefore be desirable to have planar EMI inductors using E-E magnetic cores that overcome the limitations of conventional implementations.

SUMMARY OF THE INVENTION

The present invention comprises a power bus bar assembly comprising improved planar electromagnetic interference (EMI) inductors. The bus bar assembly and planar inductors may be used in electric vehicle charging systems, inverters, and other power conditioning equipment, and the like.

An exemplary power bus bar assembly or planar inductor comprises upper and lower E-E magnetic cores, and upper and lower flat bus bars that are insulated from each other and that have a plurality of core cut-outs that allow the cores to pass through them, and wherein the core cut-outs form an electrical path through the E-E cores that forms a turn that provides a predetermined amount of inductance.

The bus bars may be arranged to form turns in the same direction or opposing directions that provide for a common mode and differential mode inductors, respectively. Different core materials and stacking of multiple cores may be used to improve the frequency response of the inductor. In particular, inductance can be increased by adding additional stacked cores, or different materials can be used for each core, or both.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 3 illustrates bus bars that provide for a common mode inductor;

FIG. 4 illustrates bus bars that provide for a differential mode inductor; and

FIG. 5 illustrates the use of different core materials and stacked cores to improve frequency response.

DETAILED DESCRIPTION

Figure 1:
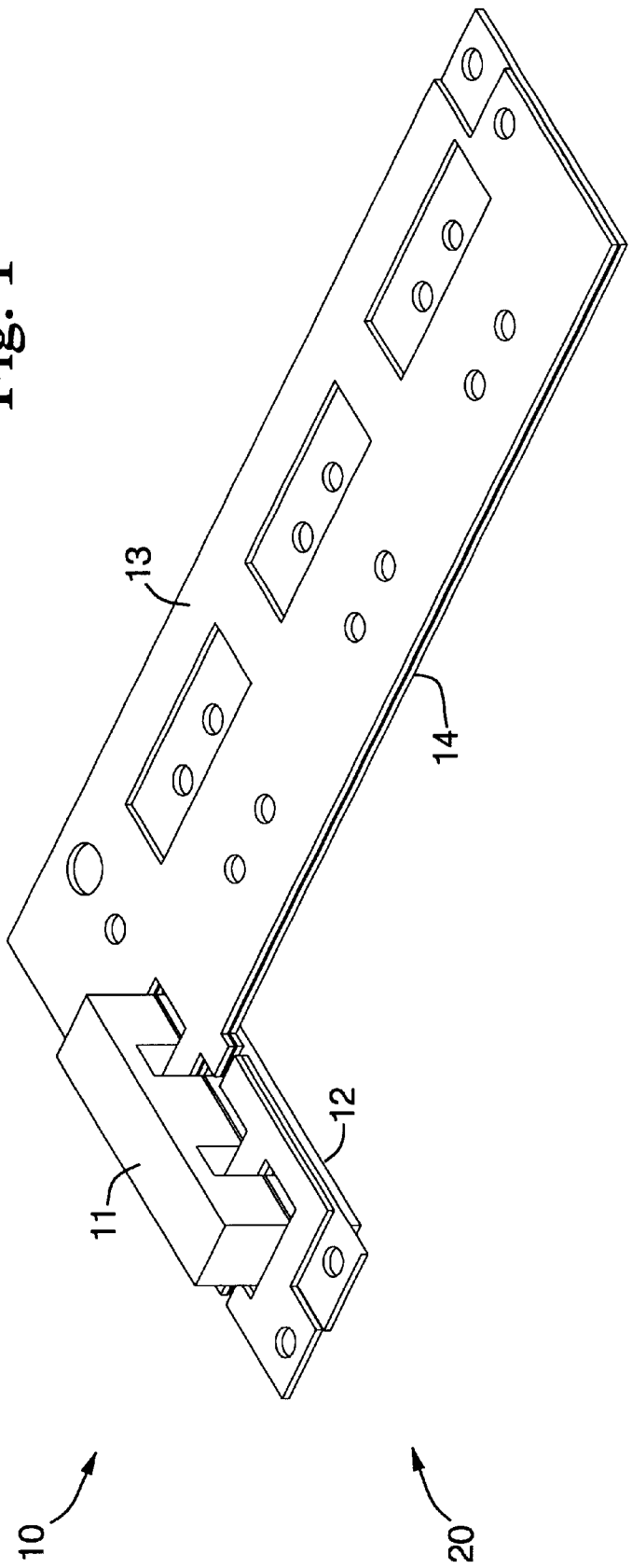
FIG. 1 illustrates a power bus bar assembly comprising an exemplary planar EMI inductor in accordance with the principles of the present invention.

Referring to the drawing figures, FIG. 1 illustrates a power bus bar assembly 10 comprising an exemplary planar EMI inductor 20 in accordance with the principles of the present invention. The exemplary planar EMI inductor 20 is a high power, high current EMI inductor was realized using low cost standard upper and lower E-E magnetic cores 11, 12, and a set of upper and lower flat stamped bus bars 13, 14. The respective bus bars 13, 14 are insulated from each other. This may be achieved by coating the respective bus bars 13, 14 with an insulating coating 15 (powder coating, for example) or providing an intermediate insulating member 15 between the bus bars 13, 14. Additional details of the exemplary planar EMI inductor 20 will be described with reference to FIGS. 2–5.

Figure 2:
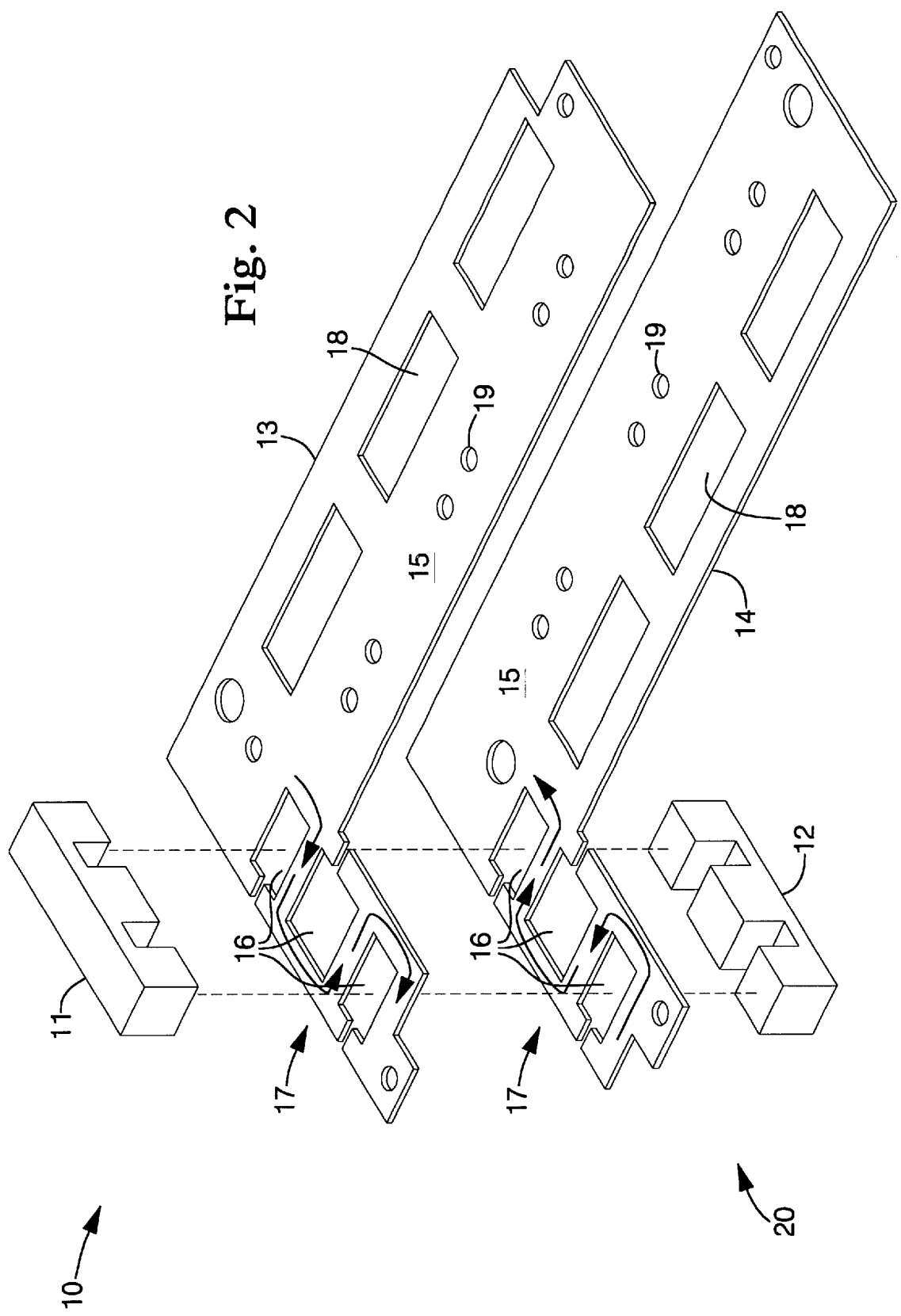
FIG. 2 illustrates an exploded view of the power bus bar assembly shown in FIG. 1.

FIG. 2 illustrates an exploded view of the power bus bar assembly 10 and planar EMI inductor 20 shown in FIG. 1. The bus bars 13, 14 have core cut-outs 16 to allow the cores 11, 12 to pass through them, and the core cut-outs 16 form an electrical path through the E-E cores 11, 12. The path through the E-E cores 11, 12 forms a turn 17 that provides inductance, illustrated by the arrowed lines in FIG. 2. A plurality of (rectangular) cutouts 18 are provided in each of the bus bars 13, 14 that are generally aligned with holes 19 in the other bus bar 13, 14 that are used to secure terminals of power switching devices (not shown) to the bus bars 13, 14.

The bus bars 13, 14 may be arranged to form turns 17 in the same direction or opposing directions. FIG. 3 illustrates the configuration of bus bars 13, 14 that provide for a common mode inductor 20. In this example the current path in the bus bar 13 is parallel to that in the bus bar 14, though in opposite directions around the extending stems of the E-E cores 11, 12. FIG. 4 illustrates the configuration of bus bars 13, 14 that provide for a differential mode inductor 20. In this example the current path in the bus bar 13 is complementary to that in bus bar 14. That is, the current in bus bar 13 travels in a partial path around each of the stems of E-E cores 11, 12 and the current in bus bar 14 makes a partial path around each of the stems of E-E cores 11, 12, each travelling in the same direction with respect to the axis of each of the stems of the E-E cores 11, 12. Thus, a common mode inductor 20 or differential mode inductor 20 may be realized using the same components.

FIG. 5 illustrates the use of different core materials and stacking of multiple cores 11, 11a, 12, 12a to improve the frequency response of the inductor 20. Inductance can be increased by adding additional stacked cores 11a, 12a, or different materials can be used for each core 11, 12, or both.

In producing the planar EMI inductor 20 of the present invention, low cost materials are used, and no terminals or fasteners are required. The inductor 20 has low end-to-end coupling that provides for extended high frequency performance. Manufacturing of the planar EMI inductor 20 involves low touch labor and associated costs. The basic structure of the planar EMI inductor 20 can be extended to form differential or common mode inductors 20, and may employ multiple turns 17 using multiple sets of bus bars 11, 12. Two or more core materials may be used to extend the frequency range of the inductor 20.

The planar EMI inductors 20 use standard E-E magnetic cores 11, 12 which are the lowest cost core available. Stamped bus bars 13, 14 require no further machining or bends which results in lower touch labor costs. The only labor required during assembly is to bond the halves of the core 11, 12 together, which can be done in a few seconds or automatically.

The simple design of the planar EMI inductors 20 eliminates hand building and variations in manufacturing. The use of powder coated bus bars 13, 14 provide superior insulation between the bus bars 13, 14 and cores 11, 12. A single planar turn 17 provides the least end-to-end capacitive coupling and therefore the best high frequency performance. Multiple cores 11, 12 may be stacked to add inductance or extend the useful frequency range using core of different materials. The planar EMI inductors 20 are superior to all conventional the E-E core inductors since it eliminates foil windings or complex bent bus bars.

Thus, planar EMI inductors using E-E magnetic cores have been disclosed. It is to be understood that the above-described embodiments are merely illustrative of one of the many specific embodiments that represent applications of the principles of the present invention. Clearly, numerous and other arrangements can be readily devised by those skilled in the art without departing from the scope of the invention.

What is claimed is:

1. A power bus bar assembly comprising:
    a planar inductor comprising:
    upper and lower E-E magnetic cores; and
    upper and lower flat bus bars that are insulated from each other and each of the flat bus bars having a plurality of core cut-outs that allow the cores to pass through them, and wherein the core cut-outs define a serpentine-shaped portion in each of the upper and lower flat bus bars to provide an electrical path through the E-E cores that forms turns to provide a predetermined amount of inductance.

2. The assembly recited in claim 1 wherein the upper and lower flat bus bars comprise stamped bus bars.

3. The assembly recited in claim 1 wherein the upper and lower flat bus bars that are insulated using an insulating coating.

4. The assembly recited in claim 1 wherein the upper and lower flat bus bars that are insulated using an intermediate insulating member between the bus bars.

5. The assembly recited in claim 1 wherein each bus bar further comprises a plurality of cutouts that are generally aligned with holes in the other bus bar that are used to secure terminals of power switching devices to the bus bars.

6. The assembly recited in claim 1 wherein the turns of the electrical path in the upper flat bus bar are in the same direction as the turns of the electrical path in the lower flat bus bar to provide for a common mode inductor.

7. The assembly recited in claim 1 wherein the turns of the electrical path in the upper flat bus bar are in an opposite direction as the turns of the electrical path in the lower flat bus bar to provide for a differential mode inductor.

8. The assembly recited in claim 1 wherein the upper and lower E-E magnetic cores comprise different core materials.

9. The assembly recited in claim 1 wherein the upper and lower E-E magnetic cores comprise multiple cores.

10. The assembly recited in claim 1 wherein the upper and lower E-E magnetic cores comprise multiple cores that comprise different core materials.

11. A planar inductor comprising:
    upper and lower E-E magnetic cores; and
    upper and lower flat bus bars that are insulated from each other and each of the upper and lower flat bus bars having a plurality of core cut-outs that allow the cores to pass through them, and wherein the core cut-outs define a serpentine-shaped portion in each of the upper and lower flat bus bars to provide an electrical path through the E-E cores that forms turns to provide a predetermined amount of inductance.

12. The inductor recited in claim 11 wherein the upper and lower flat bus bars comprise stamped bus bars.

13. The inductor recited in claim 11 wherein the upper and lower flat bus bars that are insulated using an insulating coating.

14. The inductor recited in claim 11 wherein the upper and lower flat bus bars that are insulated using an intermediate insulating member between the bus bars.

15. The inductor recited in claim 11 wherein each bus bar further comprises a plurality of cutouts that are generally aligned with holes in the other bus bar that are used to secure terminals of power switching devices to the bus bars.

16. The inductor recited in claim 11 wherein the turns of the electrical path in the upper flat bus bar are in the same direction as the turns of the electrical path in the lower flat bus bar to provide for a common mode inductor.

17. The inductor recited in claim 11 wherein the turns of the electrical path in the upper flat bus bar are in an opposite direction as the turns of the electrical path in the lower flat bus bar to provide for a differential mode inductor.

18. The inductor recited in claim 11 wherein the upper and lower E-E magnetic cores comprise different core materials.

19. The inductor recited in claim 11 wherein the upper and lower E-E magnetic cores comprise multiple cores.

20. The inductor recited in claim 11 wherein the upper and lower E-E magnetic cores comprise multiple cores that comprise different core materials.

\* \* \* \* \*